(12) United States Patent
Gibson et al.

(10) Patent No.: US 9,812,500 B2
(45) Date of Patent: Nov. 7, 2017

(54) NEGATIVE DIFFERENTIAL RESISTANCE CIRCUIT ELEMENT

(71) Applicant: Hewlett Packard Enterprise Development LP, Houston, TX (US)

(72) Inventors: Gary Gibson, Palo Alto, CA (US); Warren Jackson, San Francisco, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/114,010

(22) PCT Filed: Jan. 31, 2014

(86) PCT No.: PCT/US2014/014093
§ 371 (c)(1),
(2) Date: Jul. 25, 2016

(87) PCT Pub. No.: WO2015/116152
PCT Pub. Date: Aug. 6, 2015

(65) Prior Publication Data
US 2016/0351622 A1 Dec. 1, 2016

(51) Int. Cl.
*G11C 13/00* (2006.01)
*H01L 27/24* (2006.01)
(Continued)

(52) U.S. Cl.
CPC ......... *H01L 27/2418* (2013.01); *G11C 7/04* (2013.01); *G11C 11/1659* (2013.01);
(Continued)

(58) Field of Classification Search
CPC ............ H01L 27/2418; H01L 45/1286; H01L 45/145; G11C 13/0007; G11C 13/003
See application file for complete search history.

(56) References Cited

U.S. PATENT DOCUMENTS

| 6,812,084 B2 | 11/2004 | King |
| 2009/0231910 A1 | 9/2009 | Liu et al. |

(Continued)

FOREIGN PATENT DOCUMENTS

EP   1892722 A   2/2008

OTHER PUBLICATIONS

Alexandrov, A.S. et al., Current-controlled Negative Differential Resistance Due to Joule Heating in TiO2, Retrieved on Dec. 10, 2013, 13 pages.

(Continued)

*Primary Examiner* — Tri Hoang
(74) *Attorney, Agent, or Firm* — Fabian VanCott (57) ABSTRACT

A circuit component that exhibits a region of negative differential resistance includes: a first layer of material; and a second layer of material in contact with the first layer of material, the contact forming a first self-heating interface. The first self-heating interface is structured such that an electrical current flowing from the first layer of material to the second layer of material encounters an electrical impedance occurring at the first interface that is greater than any electrical impedance occurring in the first and second layers of material, wherein heating occurring at the first interface is dominated by Joule heating caused by the electrical impedance occurring at the first interface, and wherein the electrical impedance occurring at the first interface decreases with increasing temperature to induce a region of negative differential resistance.

13 Claims, 9 Drawing Sheets

(51) Int. Cl.
*H01L 45/00* (2006.01)
*G11C 11/16* (2006.01)
*G11C 7/04* (2006.01)

(52) U.S. Cl.
CPC ........ *G11C 13/003* (2013.01); *G11C 13/0007* (2013.01); *G11C 13/0023* (2013.01); *H01L 45/00* (2013.01); *H01L 45/1286* (2013.01); *H01L 45/145* (2013.01); *G11C 2213/73* (2013.01); *G11C 2213/76* (2013.01)

(56) References Cited

U.S. PATENT DOCUMENTS

| | | | |
|---|---|---|---|
| 2012/0104346 A1 | 5/2012 | Yi et al. | |
| 2013/0001494 A1 | 1/2013 | Chen et al. | |
| 2013/0021835 A1 | 1/2013 | Hwang et al. | |
| 2014/0003139 A1 | 1/2014 | Pickett et al. | |
| 2014/0029327 A1* | 1/2014 | Strachan | H01L 45/04 365/148 |

OTHER PUBLICATIONS

International Search Report & Written Opinion, dated Oct. 27, 2014, PCT Patent Application No. PCT/US2014/014093, 13 pages.

* cited by examiner

NEGATIVE DIFFERENTIAL RESISTANCE CIRCUIT ELEMENT

BACKGROUND

Memory structures such as DRAM and ReRAM find increasingly important applications in modern computation and communication, as do related components, such as memristors and neuristors, and other structures, such as amplifiers, oscillators, antennas and the like. As the use of digital data increases, the demand for faster, smaller, and more efficient operation of such structures increases, particularly in regard to memory structures. One type of memory structure that has recently been developed a crossbar memory array. A crossbar memory array includes a set of upper parallel wires that intersect a set of lower parallel wires. A crossbar array having n upper wires and m lower wires generally provides n*m interconnections connecting the upper set of wires to the lower set of wires. A programmable programmable element configured to store digital data may be placed at each intersection of the wires.

BRIEF DESCRIPTION OF THE DRAWINGS

The accompanying drawings illustrate various examples of the principles described herein and are a pan of the specification. The illustrated examples are merely examples and do not limit the scope of the claims.

Throughout the drawings, identical reference numbers designate similar, but not necessarily identical, elements.

DETAILED DESCRIPTION

Crossbar arrays find applications in many areas of modern computing and communication, including, for example, in communication networks and FPGAs. A memory array utilizing crossbar architectures is subject to a number of design constraints. One of these constraints limits the number of programmable elements that can be placed along a particular wire within the memory array. The number of programmable elements is constrained because having too many programmable elements along a particular wire makes it more difficult to isolate a particular programmable element for reading and writing operations.

For example, particular programmable elements within a crossbar array are often read from or written to by applying half a read or write voltage to one wire connected to the target programmable element and the other half read or write voltage to the other wire connected to the target programmable element. This arrangement applies a full read or write voltage to the target programmable element while applying only half of the read or write voltage to the remaining, or half-selected, programmable elements. The half selected programmable element are those programmable elements positioned along the same upper and lower lines (or row and column lines) as a fully selected target programmable element. When half the read or write voltage is applied to the half-selected programmable elements, currents are produced that add to the current sensed, for example, by the reading circuitry used to sense the electric current from the target programmable element; a fraction of the currents used to write also pass through half-selected write elements. These additional currents can adversely impact the read, write and erase processes. For example, the currents can cause a misread of the state of a target programmable element and can cause inadvertent writing during the course of many reads, sometimes referred to as "read disturb."

Each half-selected programmable element contributes a small amount of unwanted current (sometimes referred to as a "sneak current") to sensing or writing circuitry used to sense or write with the current flowing through the target programmable element. To limit the amount of electric current contributed by the half-selected programmable elements, non-linear selecting devices or selectors may be used. Selectors of the type described herein facilitate programmable elements having high-degrees of nonlinearity. Programmable elements having high degrees of nonlinearity allow a memory array to have greater numbers of programmable elements along a particular line. For example, where sneak currents are otherwise on the order of the signal current, a nonlinearity limiting the sneak current to $\frac{1}{1000}^{th}$ of the current at one-half the read or write voltage permits upward of about 1,000 programmable elements along a particular upper or lower line.

The disclosure provided herein describes a two-terminal electrical device that exhibits a region of negative differential resistance. This device is generally useful for app cations in memory, amplifiers, oscillators, mixers, antennas and the like. It can also be employed as a highly nonlinear selector in crossbar arrays that need to be addressed from the ends of their row and column lines. Selectors may generally be used to "select" a desired device over others in, for example, a crossbar array of two-terminal devices, including but not limited to memory devices. Thus, while selectors are useful in crossbar memory architectures, they are also useful in other applications, such as temperature, pressure or optical sensing. In general, negative differential resistance devices of the type disclosed herein are useful in any application where the current flowing through a device used in series with the negative differential resistance device is to be determined or controlled. While the disclosure herein often describes the construction, operation and use of two-terminal negative differential resistance devices as selectors with application to computer architectures, it should be understood that such devices are useful in other applications as well. Accordingly, the description that follows should be understood to encompass the construction, operation and use of two-terminal negative differential resistance devices, generally, and not be limited to use in computer architectures or crossbar arrays.

As mentioned above, particular programmable elements within a crossbar array are often read from or written to by applying half the read or write voltage to one wire connected to the target programmable element and the other half read or write voltage to the other ire connected to the target programmable element. This arrangement applies the full read or write voltage to the target programmable element while only applying half of the read or write voltage to the half-selected programmable elements. When half the read or write voltage is applied to the half-selected programmable elements, a current is produced that adds to the current sensed by the reading or writing circuitry used to sense the electric current flowing through the target programmable element. Each half-selected programmable element contributes a small amount of unwanted current (sometimes referred to as "sneak current") to sensing circuitry used to sense the current flowing through the target programmable element. To limit the amount of electric current contributed by the half-selected programmable elements, non-linear devices may be used. As stated previously, it is generally desirable to use programmable elements exhibiting a high degree of non-linearity. Without limiting the disclosure herein, non-linearity of programmable elements may be achieved by incorporating a selector into the programmable element. For example, a selector or selector device may be connected in series with a memristive element to form a programmable element. The resulting nonlinearity of the programmable element arises primarily from the nonlinearity of the selector.

In light of this and other issues, the present specific on discloses negative differential resistance ("NDR") circuit elements based on interfaces exhibiting highly temperature-dependent conduction, where the electrical conduction increases with increasing temperature. The present specification further discloses the use of such NDR circuit elements, for example, as selectors in crossbar memory structures that use programmable elements positioned between the upper and lower lines of the crossbar array. The NDR circuit elements or selectors disclosed herein, when used in series with a relatively linear memory device, can provide a high overall nonlinearity for the programmable element, defined generally as $K=I(V)/I(V/2)$, where I is the device current, V is the voltage across the programmable element (i.e., across the memory device+selector) and V/2 is the half-select voltage. When used in memory structures such as crossbar memory structures, the NDR circuit elements or selectors substantially reduce current contributions (or sneak currents) arising from half-selected programmable elements. Further details on the construction and application of the NDR circuit elements or selectors disclosed herein and the nonlinearity of the devices is provided below. While the following disclosure is directed primarily to NDR circuit elements, or selectors based on such elements and their use in crossbar arrays, it should be understood that the NDR circuit elements described herein are applicable to many other applications where high degrees of nonlinearity at nanoscale dimensions are desired.

An illustrative circuit component that exhibits a region of negative differential resistance includes: a first layer of material; and a second layer of material in contact with the first layer of material, the contact forming a first self-heating interface. In this example, the first self-heating interface is structured such that an electrical current flowing from the first layer of material to the second layer of material encounters an electrical impedance occurring at the first interface that is greater than any electrical impedance occurring in the first and second layers of material, wherein heating occurring at the first interface is dominated by Joule heating caused by the electrical impedance occurring at the first interface, and wherein the electrical impedance occurring at the first interface decreases with increasing temperature to induce the region of negative differential resistance.

In another example, a self-heating negative differential resistance circuit component includes a first layer of metallic material; and a second layer of semiconductor or insulator material in contact with the first layer of metallic material, the contact forming a first self-heating interface having a first electrical impedance. The first self-heating interface is structured such that an electrical current flowing from the first layer of material to the second layer of material through the first self-heating interface results in generation of thermal energy by the first self-heating interface that is greater than any generation of thermal energy occurring in the first and second layers of material due to bulk heating. The thermal energy generated by the first self-heating interface is dominated by Schottky emission and the barrier height at the first self-heating interface is from about 0.1 eV to about 0.5 eV. The first electrical impedance decreases with increasing temperature to induce a region of negative differential resistance.

In another example of the principles disclosed herein, a method of interfacial heating in a self-heating negative differential resistance circuit component includes providing a first layer of material and a second layer of material in contact with the first layer of material. The contact toms a first self-heating interface structured such that an electrical current flowing from the first layer of material to the second layer of material encounters an electrical impedance occurring at the first self-heating interface that is greater than any electrical impedance occurring in the first and second layers of material. Heating occurring at the first self-heating interface is dominated by Joule heating caused by the electrical impedance occurring at the first self-heating interface. The electrical impedance occurring at the first self-heating interface decreases with increasing temperature to induce a region of negative differential resistance. The method concludes with providing electrical current flowing from the first layer of material to the second layer of material through the first self-heating interface.

Through use of the apparatus, methods and systems described herein, highly nonlinear circuit elements, or crossbar arrays, for example, utilizing highly nonlinear selectors in programmable elements, can be realized. In the example of crossbar arrays, the use of highly nonlinear selectors to create highly nonlinear programmable elements within the crossbar array increases the number of programmable elements that can be placed along a particular row line or column line of the crossbar array. This allows for greater block sizes and thus more efficient memory structures and also allows for reduced cost and power consumption. As stated above, while the description of the relevant principles is provided in the context of selectors used in programmable elements and crossbar arrays, the same principles are generally applicable to any appliance where the current flowing through a device used in series with the negative differential resistance device is to be determined or controlled. Accordingly, the description that follows should be understood to encompass the construction, operation and use of two-terminal negative differential resistance devices, generally, and not be limited to use in computer architectures or crossbar arrays.

In the following description, for purposes of explanation, numerous specific details are set forth in order to provide a thorough understanding of the present apparatus, systems and methods. It will be apparent, however, to one skilled in the art that the present apparatus, systems and methods may be practiced without these specific details. Reference in the specification to "an example," "an example" or similar language means that a particular feature, structure, or characteristic described in connection with the example is included in at least that one example, but not necessarily in other examples.

Throughout the remainder of this specification and in the appended claims, and unless otherwise specified, the terms "access voltage," "read voltage" and "write voltage," as well as the term "voltage" in general, are used to refer to the voltage drop across a programmable element, as opposed to the voltages applied to the ends of the row and column lines that connect to the programmable element. The description within this specification will describe operations primarily in terms of read or select voltages. However, it will be apparent to those skilled in the art that the principles described herein can apply to write and erase voltages as well in addition to non-memory based applications.

Figure 1:
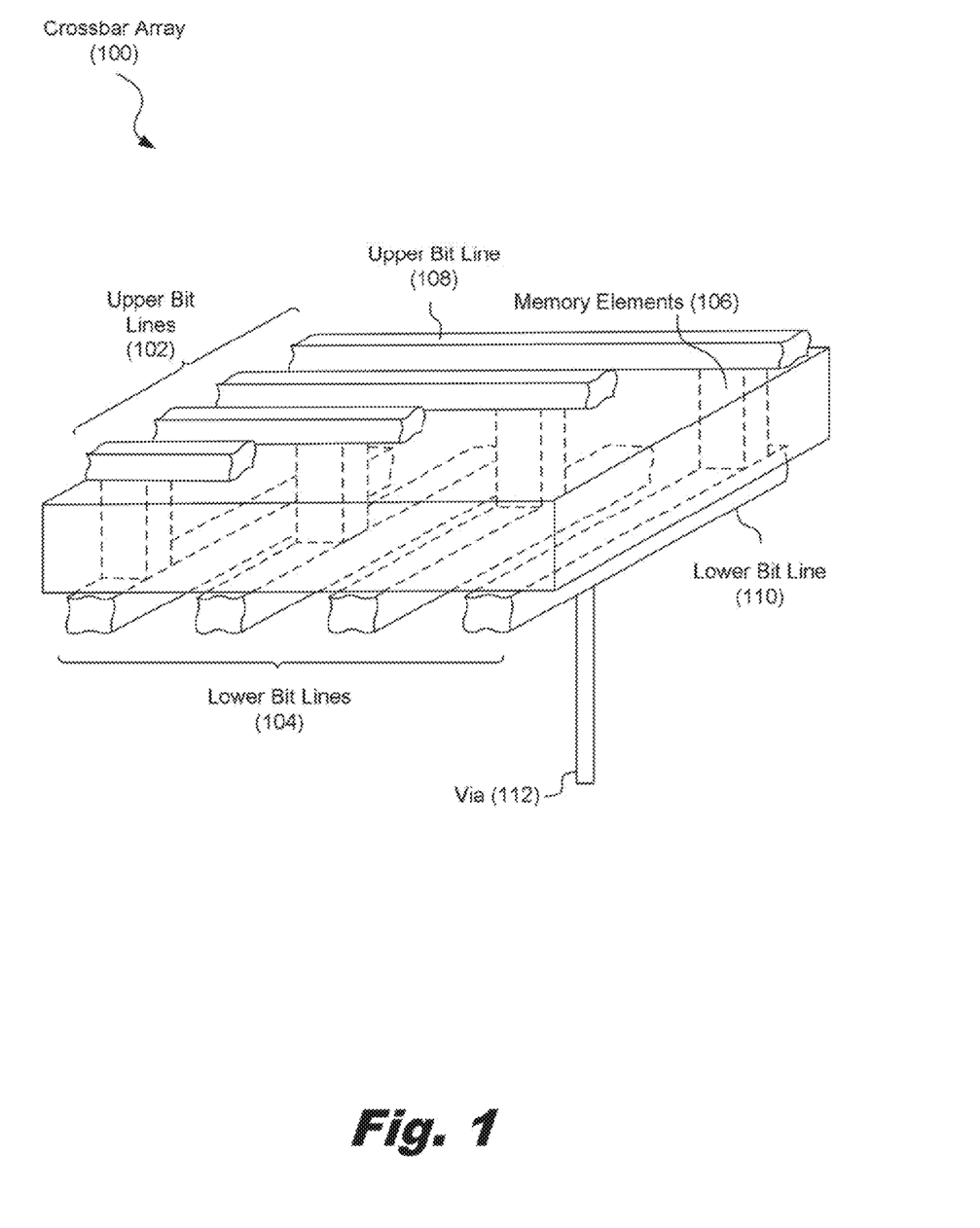
FIG. 1 is a diagram showing an illustrative crossbar array, according to one example of the principles described herein.

Referring now to the figures. FIG. 1 is a diagram showing an illustrative crossbar memory array architecture (100). According to certain illustrative examples, the crossbar memory array (100) may include an upper set of lines (102) which may generally be in parallel. Additionally, a lower set of lines (104) is generally perpendicular to, and intersects, the upper lines (102). The upper lines and the lower lines may be referred to as word lines or bit lines depending on how data is written to or read from the memory array (100).

Programmable crosspoint elements (106) are formed at the intersections between an upper line (108) and a lower line (110). For purposes of illustration, the upper set of parallel lines will sometimes be referred to as row lines and the lower set of parallel lines will sometimes be referred to as column lines. Terms such as row, column, upper, and lower are not used to indicate a specific position or orientation. Rather, the terms are used to distinguish position or orientation relative to one another.

According to certain illustrative examples, the programmable crosspoint elements (106) may be memristive devices, having a selector in series with a programmable element, such as a memristor. In one example, the selector and programmable element may be fused together without an intervening layer—e.g., electrode—to comprise a composite device. Memristive devices exhibit a "memory" of past electrical conditions. For example, a memristive device may include a matrix material that contains mobile dopants. These dopants can be moved within a matrix to dynamically alter the electrical operation of an electrical device, such as the resistance of that device.

Figure 2:
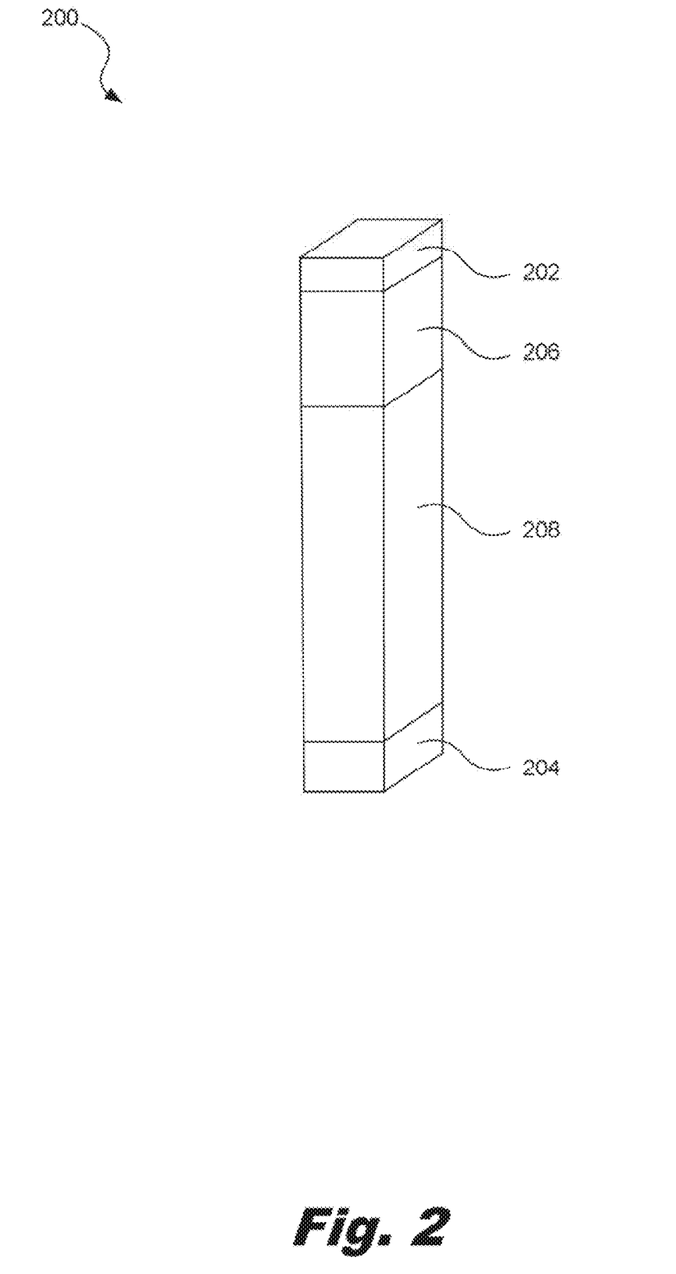
FIG. 2 is a diagram illustrating a selector element positioned adjacent a memristive element, according to one example of the principles described herein.

FIG. 2 illustrates one example of a programmable element (106) suitable for use in a crossbar memory array (100). A memristive memory device (200) includes a first electrode (202) and a second electrode (204), sandwiching a selector (206) and a memory device, such as a memristive device or memristor (208). The memristor (208) may be a thin film (generally less than 20 nm thick) and, in many cases, is nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time needed to drift enough dopants into or out of a local region of the film to substantially change its conductivity, and, hence, its state, is relatively rapid. Another advantage of nanometer scale memristive devices is that a large electrical field can be produced by a relatively small applied voltage across the device. The memristor (208) is sometimes referred to as a switch, in that the memristor may assume an "OFF" state, where little to no conductance for electric current occurs, and an "ON" state, where increased conductance for current occurs.

As discussed in further detail below, the programmable element (106) includes a selector (206). The selector (206) generally exhibits a highly nonlinear current-voltage response over a range of voltages, typically both, positive and negative. De wending on the application, the nonlinearity of the selector (206) serves to block or substantially reduce current at sub-threshold voltages. For example, the selector (206) may serve to block or substantially reduce current to the memristive device or memristor (208) at voltages less than the full read or write voltages referred to above. In one example, the selector exhibits a nonlinearity such that the current flowing through the selector at the half-voltage (write or read) is much less than the current at the corresponding full voltage. Stated mathematically, the nonlinearity, K, of the programmable element is expressed as $K=I(V)/I(V/2)>>2$, where V is the voltage drop across the programmable element and $K=2$ is the value expected for an essentially linear device. In the discussion below, details of a selector based on a negative differential circuit element and its use in memory systems, such as crossbar memory arrays having memristive memory devices, are provided. While the discussion provides examples of the selectors being used with memresistive memory devices, one skilled in the art will appreciate that the selectors disclosed herein can be used in other memory systems, such as, for example, those based on phase change memory devices.

Figure 3A:
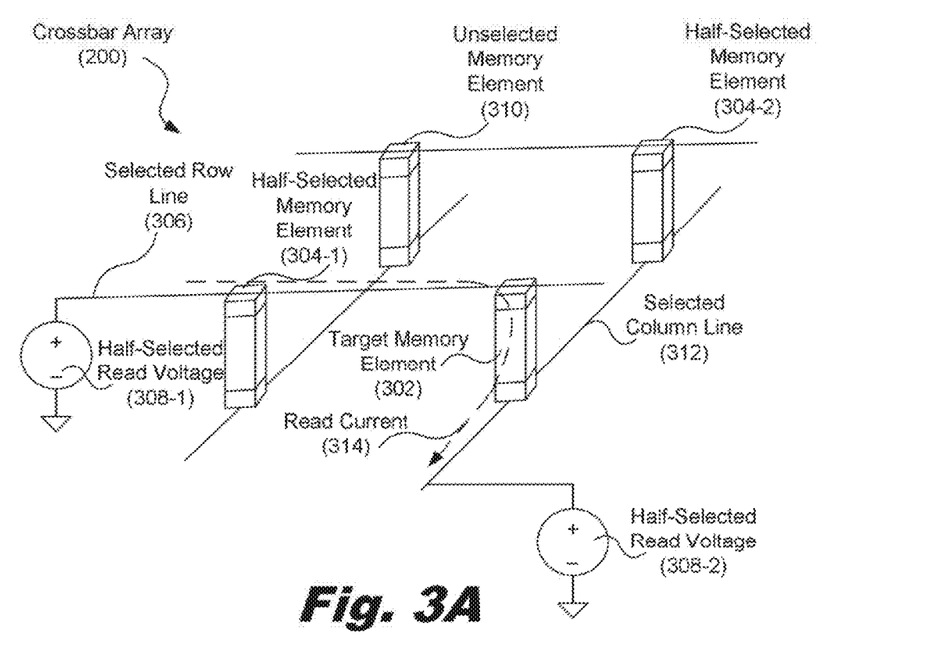
FIGS. 3A-3B are diagrams showing an illustrative section of a crossbar array with select voltages applied, according to one example of the principles described herein.
Figure 3B:
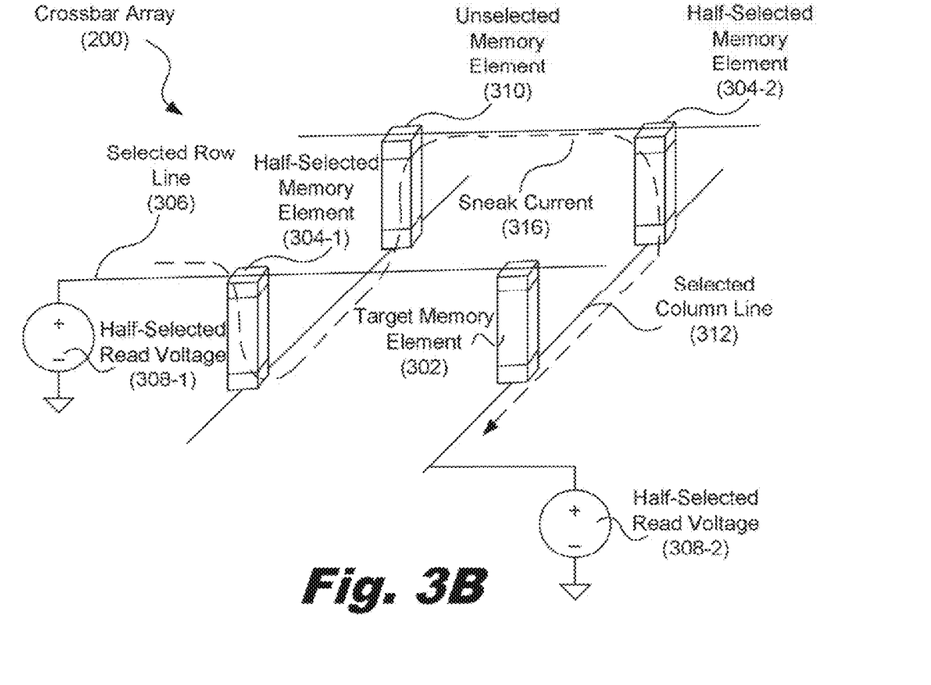

FIGS. 3A-3B are diagrams showing an illustrative section of a crossbar array. As mentioned above, a crossbar array may be formed by placing programmable elements at intersections between row lines and column lines. To access a particular programmable element, a select voltage is applied across that element. The programmable element to be accessed will be referred to as the target programmable element (302). The following will describe an example of how to access the target programmable element (302) for a reading operation.

To read the state of the target programmable element (302), a half-select read voltage (308-1) is applied to the row line (306) connected to the target programmable element (302) (voltage drops across the row and column lines are assumed negligible for purposes of this discussion). This row line will be referred to as the selected, row line (306). With the half-select read voltage applied, each programmable element (304-1) along the selected row line (306), including the target programmable element (302), becomes half selected (assuming the unselected lines are grounded). To fully select the target programmable element (302), a half-select read voltage (308-2) is applied to the column line connected to the target programmable element (302). This column line will be referred to as the selected column line (312). With the half-select read voltage (308-2) applied to the selected column line (312), the programmable elements (304-2) along the selected column line will become half selected (assuming the unselected lines are grounded), except for the target programmable element (302) which becomes fully selected. The half-select read voltage (308-2) applied to the column line (312) may be the inverse polarity of the half-select read voltage (308-1) applied to the selected row line (306). This will cause the voltage drop across the target programmable element (302) to be the sum of both half-select read voltages (308-1, 308-2). Alternatively, the read voltage (308-1) applied to the row line (306) can be the full voltage, while the read voltage (308-2) applied to the column line (312) can be held at ground; other combinations of select voltages resulting in a full select voltage drop across the target programmable element are readily apparent. The unselected row lines and the unselected column lines may be grounded, set at a non-zero fixed voltage or left floating. The manner in which unselected lines are handled may depend on the design of the system.

With the full select voltage applied across the target programmable element (302), a read current (314) flows through the selected row line (306), the target programmable element (302), and the selected column line (312). The value or the read current will be indicative of the state or the target programmable element (302)—i.e., the state is "ON" or "OFF." Thus, sensing circuitry can be used to measure the read current and determine whether the target programmable element is storing a digital '1' or a digital '0'. Multi-bit reading or recording may also be performed using the circuitry described.

As mentioned above, when applying half-select read voltages to the row lines and column lines, programmable elements (304-1, 304-2) along those lines become half selected; or, approximately half selected if the unselected lines are left floating. This causes an electric current, sometime called a sneak current, to flow through these programmable elements (304) as well. FIG. 3B illustrates a possible path of a sneak current (316). The value of the sneak current (316) is dependent on the current to voltage relationship of the programmable elements. Using programmable elements whose current increases super-linearly with voltage substantially reduces the value of the electric current contributed by each of the half-selected programmable elements (304) or other unselected devices.

For example, if the selectors used in the programmable elements have a relatively small non-linearity in the current to voltage relationship, then the ratio between current flowing through a programmable element with the full voltage applied and the current flowing through a programmable element with the half voltage applied is relatively small, and equals K=2 for substantially linear behavior. This will cause the half-selected programmable elements (304) as well as other unselected programmable elements (310) to contribute a relatively large amount of current to the sneak current (316). Conversely, if the selectors used in the programmable elements have a high degree of non-linearity, then the ratio between current flowing through a programmable element with the full voltage applied and the current flowing through a programmable element with the half voltage applied is relatively lame. This will cause each half-selected programmable element (304) to contribute a relatively small amount to the sneak current (316). This allows more programmable elements to be placed along a particular line without creating too large of a sneak current (316). A large sneak current (316) will interfere with the read current (314) and make it difficult for the sensing circuitry to accurately determine the state of the target programmable element (302).

In light of this issue, the present specification discloses a circuit device or element, sometimes referred to as a selector, with a high degree of nonlinearity that can be used in conjunction with relatively linear memory devices to enable their use in large crossbar arrays or other systems. Particularly, a, highly nonlinear selector comprises a NDR circuit element consisting of an interface, or interfaces, having an electrical conductivity that increases strongly with increasing local temperature. Current driven across the interface results in Joule heating commensurate with the resistance encountered at the interface(s). This interfacial Joule heating and ensuing temperature rise result in a highly nonlinear current-voltage characteristic due to the strong temperature dependence of the interface's electrical conduction. Over a range of currents the differential resistance of this device is actually negative. As discussed further below, the interfaces contemplated herein include pn-junctions, Schottky junctions, and interfaces whose electrical conduction is dominated by Schottky emission. The interfaces contemplated herein are generally referred to as self-heating interfaces.

Figure 4A:
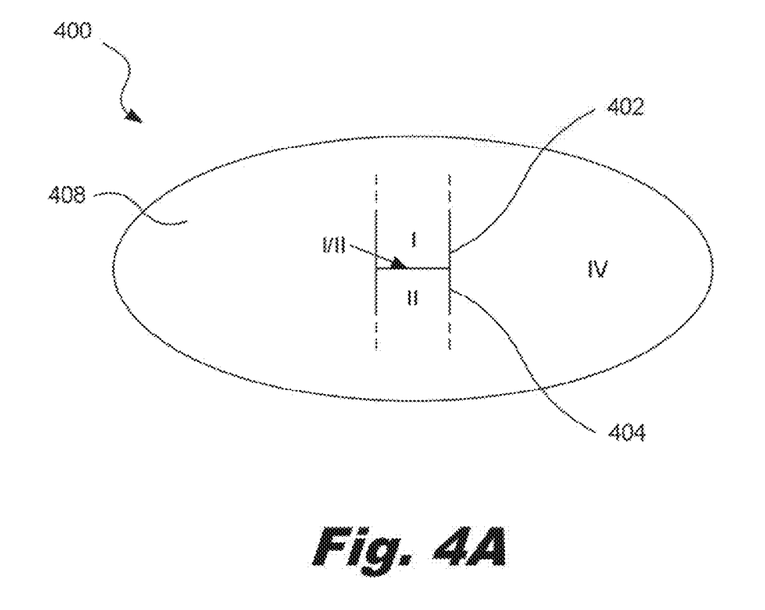
FIG. 4A is a diagram showing an illustrative NDR circuit device or selector according to one example of the principles disclosed herein.

FIG. 4A is a diagram showing an illustrative NDR circuit device (400) according to the principles disclosed herein. According to certain illustrative examples, the NDR circuit device (400) includes a first layer of material (402) and a second layer of material (404) that contact at an interface I/II or, alternatively, a first self-heating interface. The first layer of material (402) and the second layer of material (404) are part of an electrically conducting path. The electrical conductivity of the interface I/II increases strongly with increasing local temperature. The current driven across the interface results in joule heating commensurate with the resistance encountered at the interface, in various examples, the first layer of material (402) is metallic and the second layer of material (404) is semiconducting, leading to an interface I/II having characteristics of a Schottky junction. In other examples, the first layer of material (402) is semiconducting and the second layer of material (404) is semiconducting, leading to an interface I/II having characteristics of a pn-junction. In the examples, the interface I/II may be embedded in an electrically insulating, but weakly thermally conducting, material or set of materials (408). Surrounding the interface I/II with weakly thermally conducting materials reduces the power the interface needs to evolve for self-heating to a temperature that increases the electrical conductivity to a point where NDR is initiated. The onset of NDR is essentially a feedback process that begins when the rate of increase of conductivity with temperature is sufficiently large such that a lower voltage can result in a higher current.

Figure 4B:
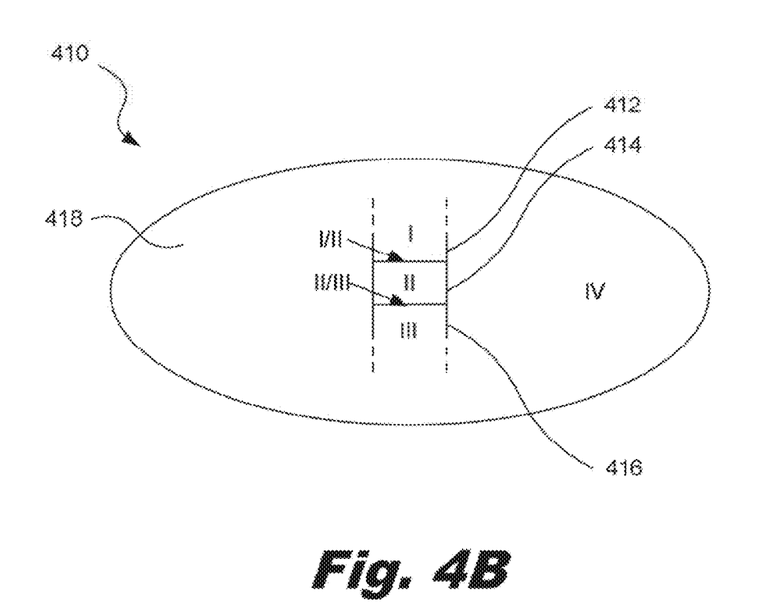
FIG. 4B is a diagram showing an illustrative NDR circuit device or selector according to one example of the principles disclosed herein.

FIG. 4B is a diagram showing an alternative illustrative NDR circuit device (410) according to the principles disclosed herein. According to certain illustrative examples, the circuit device (410) includes a first layer of material (412) and a layer of second material (414) that contact at a first interface I/II. The circuit device (410) further includes a third layer of material (416) that contacts the second layer of material (414) at a second interface II/III or, alternatively, a second self-heating interface. The first layer of material (412), the second layer of material (414) end the third layer of material (416) are part of an electrically conducting path. The electrical conductivities of the first interface I/II and the second interface II/III increase strongly with increasing temperature. The current driven across the two interfaces results in Joule heating commensurate with the resistances encountered at the interfaces. In some examples, the first layer of material (412) is metallic, the second layer of material (414) is semiconducting and the third layer of material (416) is metallic, leading to both the first interface I/II and the second interface II/III having characteristics of Schottky junctions. In other examples, the first layer of material (412) is semiconducting, the second layer of material (414) is semiconducting and the third layer of material (416) is semiconducting, leading to both the first interface and the second interface II/III having characteristics of pn-junctions. In still other examples, the first layer of material (412) is metallic, the second layer of material (414) is semiconducting and the third layer of material (416) is semiconducting, leading to the first interface I/II having characteristics of Schottky junctions and the second interface II/III having characteristics of a pn-junction. In all examples, the first interface I/II and the second interface II/III may be embedded in an electrically insulating, but weakly thermally conducting, material or set of materials (418).

The mechanisms for interfacial heating in the above examples involve current flow through pn-junctions and Schottky junctions, depending upon whether the interface is semiconductor/semiconductor or metal/semiconductor, respectively. A third mechanism involves Schottky emission, typically at a metal/semiconductor interface. Specifically, for a given polarity of the applied bias, electrical conduction between region I and region III can be dominated by Schottky emission of electrons occurring at the I/II interface. Under the reverse polarity, electron conduction between region I and region III may be dominated by Schottky emission of electrons occurring at the II/III interface. Alternatively, the electrical conduction between regions I and III may be dominated by Schottky emission of holes at interface I/II or II/III, depending on the polarity of the applied bias and the relative band offsets for electrons and holes at the two interfaces. In all examples, the resistance at the controlling interface decreases strongly with increasing local temperature and, because of Joule self-heating, results in the highly nonlinear NDR behavior. For the Schottky emission mechanism, exemplar barrier heights are in the range of 0.1-0.5 eV (electron volts). Exemplar metal-semiconductor pairs exhibiting barrier heights in this range include TiN—NbO$_2$, TaN—NbO$_2$, W—Ge, Pb—Ge, Al—Ge, Ni—Ge, Au—GaAs, Au—InSb, Ag—InSb, Au—InAs, Ni—CdS(n), Cu—CdS(n), Pt—CdSe(n), Cu—CdSe(n), Ag—CdSe(n), Ta—ZnO, In—ZnO and Cu—ZnO.

The electronic conduction and resistance effects accompanying the pn-junction, Schottky junction and Schottky emission mechanisms according to the examples and principles described in this disclosure are generally dominant over bulk electrical conduction effects occurring in the layers of material. Because these interfacial mechanisms dominate the electrical conduction, they are primarily responsible for the Joule heating that occurs in the circuit device. For example, the interfacial heating occurring at interfaces through the pn-junction, Schottky junction and Schottky emission mechanisms and the accompanying temperature-dependant conduction effects, dominate any bulk heating and accompanying effects that may occur due to Joule heating from a bulk electrical resistance in the metals, oxides or insulator materials in metal-oxide-metal ("MOM") or metal-insulator-metal ("MIM") devices. In other words, the electrical conduction characteristics arising from the principles discussed herein are primarily a result of the pn-junction, Schottky junction and Schottky emission mechanisms occurring at the interfaces and not bulk electrical conduction mechanisms or effects, such as, for example, small polaron conduction, occurring in the layers of material. The nonlinearities arising from the principles discussed herein also do not result from phase transition effects occurring within the materials employed, such as the insulator-to-metal transition ("IMT") that can occur, for example, in some transition metal oxide ("TMO") materials.

The disclosure herein thus concerns examples and principles focusing principally on pn-junction, Schottky junction and Schottky emission mechanisms occurring at or near interface regions of the NDR circuit devices or selector elements, in such examples, the heat or thermal energy generated by the interface is greater than any heat or thermal energy generated through bulk effects and, in some examples, can be at least twice as large or even orders of magnitude greater than any heat or thermal energy generated in the layers of material through bulk effects.

Figure 5:
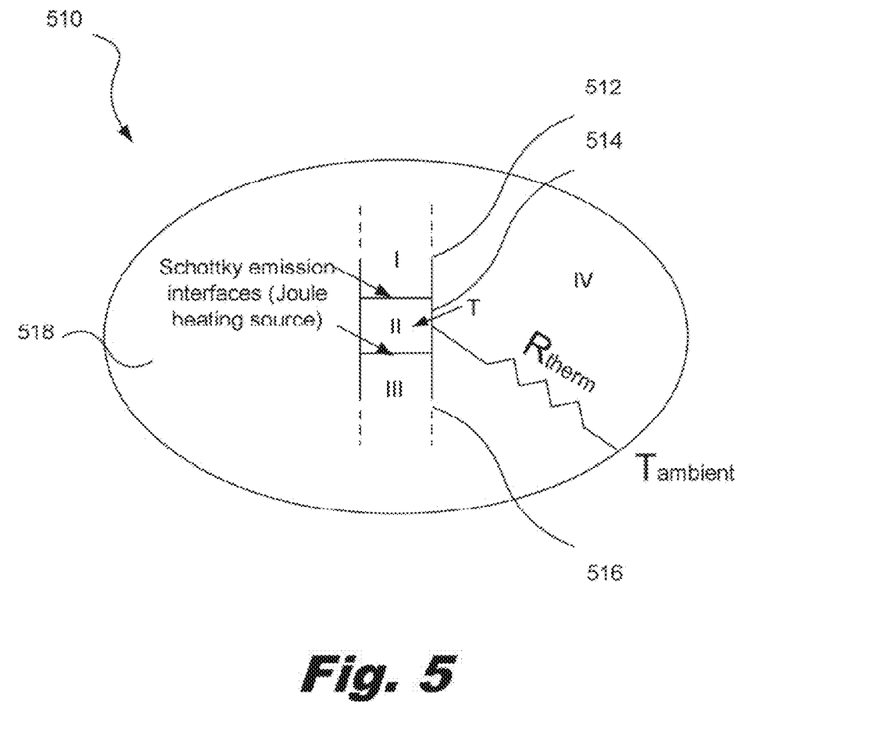
FIG. 5 is a diagram showing an illustrative NDR circuit device or selector according to one example of the principles disclosed herein.

FIG. 5 is a diagram further illustrating an exemplar NDR circuit device (510) according to the principles disclosed herein. According to certain illustrative examples, the circuit device (510) includes a first layer of material (512) and a second layer of material (514) that contact at a first interface I/II or, alternatively a first self-heating interface. The circuit device (510) further includes a third layer of material (516) that contacts the second layer of material (514) at a second interface II/III or, alternatively, a second self-heating interface. The first layer of material (512), the second layer of material (514) and the third layer of material (516) are part of an electrically conducting path. The electrical conductivities of the first interface I/II and the second interface II/III may be strongly increasing functions of the local temperature. In one example, the first layer of material (512) is a metal, the second layer of material (514) is a semiconductor and the third layer of material (516) is a metal. The first interface I/II and the second interface II/III may be embedded in an electrically insulating, but thermally conducting, material or set of materials (518). The materials may be selected such that the dominant conduction mechanism is Schottky emission at the first interface I/II or the second interface II/III, depending on the direction of current flow. Schottky emission at one or more of the interfaces may be employed as a temperature sensitive impedance. Further, being resistive, the Schottky emission results in Joule self-heating of the interfaces. The self-heating increases the temperature of the interfaces which, in turn, impacts the interfacial conductance. This feedback can result in negative differential resistance over a range of current flow.

As an example, in order to quantify the negative differential resistance for the Schottky emission based examples, the temperature across an interface may be assumed spatially uniform and approximated by:

$$T = T_{amb} + R_{therm} I * V, \qquad (Eq.\ 1)$$

where $R_{therm}$ denotes the effective thermal resistance between the interface and the thermal ground at $T_{amb}$ and $I*V$ is the power dissipated at the interface via joule heating. Substituting the above expression for temperature into the standard Schottky emission equation for current as a function of voltage and temperature provides the following transcendental equation:

$$i = (A/d^2)(t+iv)^2 e^{**}((\eta v^{1/2} - 1)/(t+iv)) \qquad (Eq.\ 2)$$

where $$I \equiv A_R (q\phi_a d/K_B)^2 i$$

$$V \equiv K_B (q\phi_B R_{therm} A_R d^2) v$$

$$\eta \equiv (K_B/(4\pi \in_r R_{therm} A_R d^3 \phi_B^3))^{1/2}$$

$$T_{amb} \equiv (q\phi_B/K_B)t$$

$A_{R'}$=Richardson constant
q=fundamental charge
$K_B$=Boltzmann constant
$\in_i$=optical frequency dielectric constant
$\phi_B$=Schottky barrier height
d=V/(electric field across insulator)
A=device area; and
$T_{amb}$=ambient temperature, Equation 2 can be solved numerically to determine the I-V characteristics for a self-heated Schottky emission interface in the limit where the thermal resistance is small across the device relative to the thermal resistance between the device and a thermal bath held at some 'ambient' temperature (i.e. the limit where the temperature is fairly uniform across the Schottky interface and Equation 1 holds).

Figure 6:
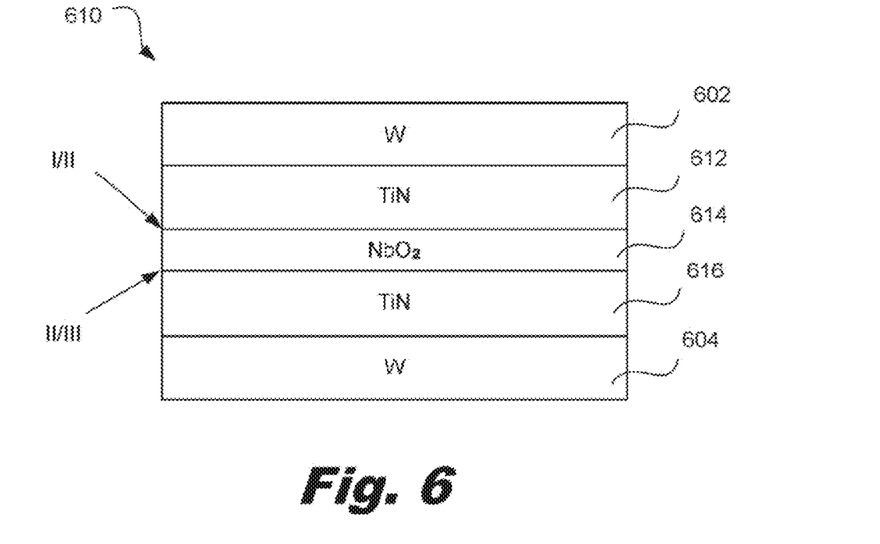
FIG. 6 is a diagram showing an illustrative NDR circuit device or selector according to one example of the principles disclosed herein.

FIG. 6 is a schematic illustrating an exemplar example of a further alternative illustrative NDR circuit device (610) according to the principles disclosed herein. The circuit device includes a first layer of material (612) and a second layer of material (614) that contact at a first interface I/II or, alternatively, a first self-heating interface. The circuit device further includes a third layer of material (616) that contacts the second layer of material (614) at a second interface II/III or, alternatively, a second self-heating interface. The first layer of material (612), the second layer of material (614) and the third layer of material (616) are part of an electrically conducting path. The first interface I/II and the second interface II/III may be embedded in an electrically insulating, but weakly thermally conducting, material or set of materials (not illustrated). The circuit device may further include a top electrode (602) and a bottom electrode (604). In various examples, the circuit device (610), as with the previously described NDR circuit devices, may be used as a selector in combination with a memory device, such as a memristor, to form a highly nonlinear memristive programmable element. The memristive programmable element can be used to form crossbar memory arrays as described above. Alternatively, the NDR circuit device (610) may be used in other non-memristor based memory arrays or devices, or in non-memory based systems or devices, where highly nonlinear device characteristics are desirable.

As discussed farther below, the mathematical model presented above has been applied to the example disclosed in FIG. 6. In particular, the model has been applied to an example where the first electrode (602) and the second electrode (604) comprise tungsten (W); the first layer of material (612) and the third layer of material (616) comprise titanium nitride (TiN) and the second layer of material (614) comprises niobium dioxide ($NbO_2$). In this example, the semiconducting $NbO_2$ layer is equivalent to Region II in FIGS. 4B and 5, and the metallic TiN layers are equivalent to Regions I and III. The W layers are electrodes or conductors that connect to an external circuit or other device components. The thickness of the $NbO_2$ layer impacts the voltage needed to obtain a sufficient electric held for the Schottky emission. Layers on the order of about 10-15 nm are found to facilitate Schottky emission as the dominant electrical conduction mechanism and, therefore, the dominant Joule heating source. The layer thickness also impacts the effective value for $R_{therm}$. Lateral dimensions on the order of about 10-100 nm facilitate uniformity of temperature across the interfaces and acceptable power needs.

Figure 7:
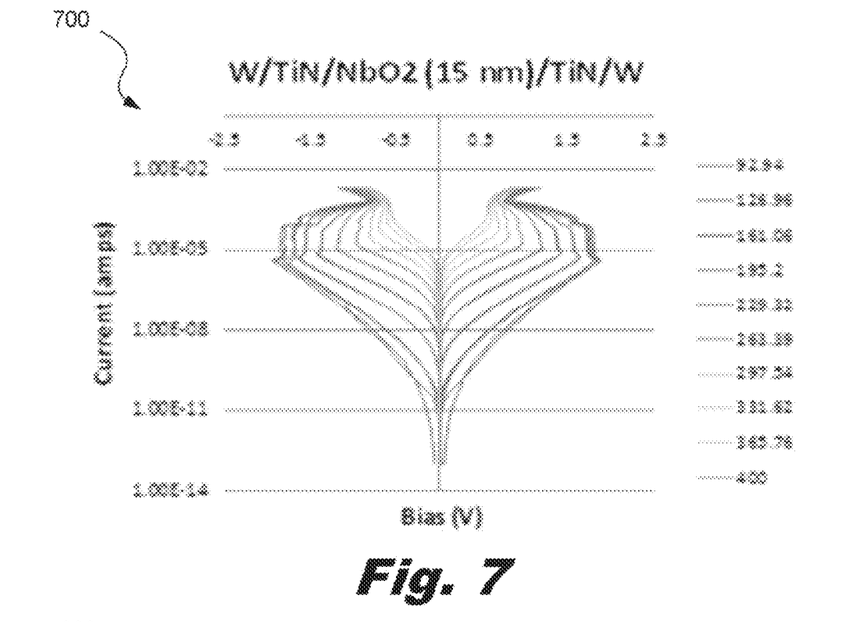
FIG. 7 provides representative I-V curves calculated for a NDR circuit device or selector according to one example of the principles disclosed herein.
Figure 8:
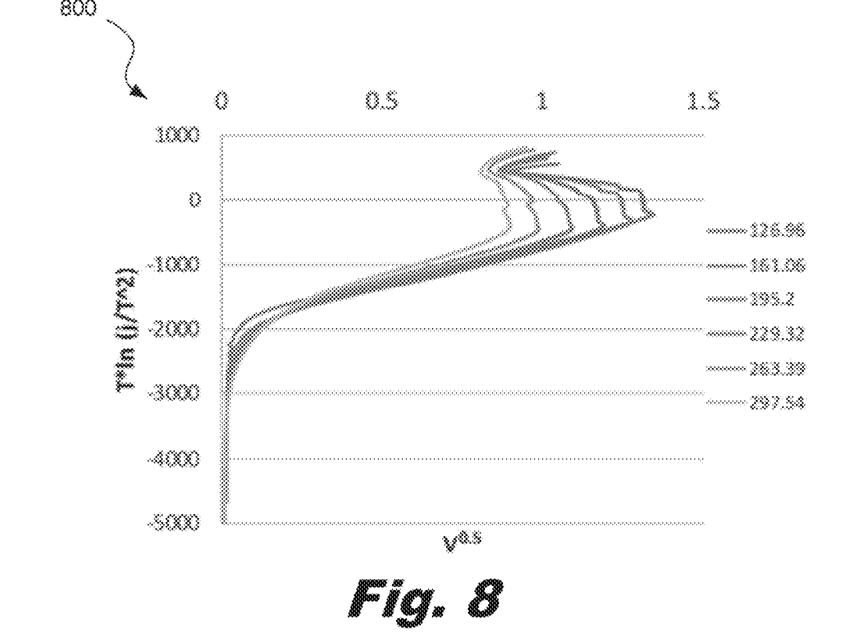
FIG. 8 provides representative Schottky curves calculated for a NDR circuit device or selector according to one example of the principles disclosed herein.

FIG. 7 provides representative I-V curves measured for a TiN/$NbO_2$/TiN device similar to the one described in FIG. 6. The ambient temperatures at which the curves were measured are provided to the right of the graph in Kelvin. FIG. 8 shows the same data provided in FIG. 7 on a Schottky plot.

A good fit to the data is obtained at low currents and temperatures for a Schottky emission barrier of about 0.18 eV. Similar results are obtained for both voltage polarities, suggesting that symmetric Schottky barriers are formed at the first interface I/II and the second interface II/III of the example TiN/$NbO_2$/TiN device.

Figure 9:
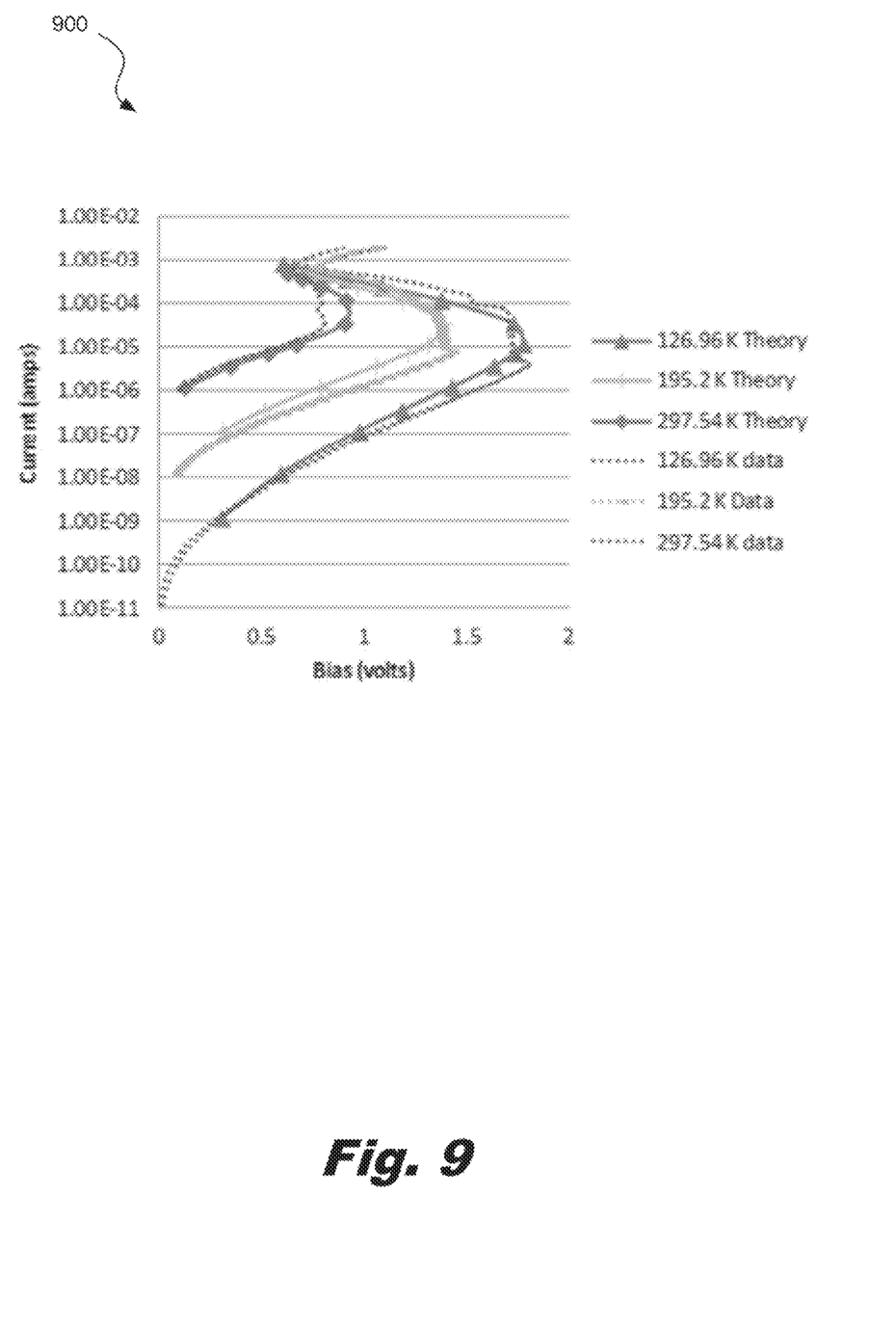
FIG. 9 provides a comparison of predicted I-V cure experimental data at three ambient temperatures.

FIG. 9 provides a comparison of predicted I-V curves with experimental data at three ambient temperatures. Using the values for the barrier height and high frequency dielectric constant determined from the Schottky graph in FIG. 8, the known device area and $NbO_2$ layer thickness, and an estimate for the thermal resistance obtained from a finite element (Comsel) model of the device, Equation 1 predicts I-V curves that closely match the experimental data. These results demonstrate that the strong temperature dependence of the conductance of a Schottky emission interface can be use create a self-heating device that exhibits negative differential resistance. A parametric analysis of Equation 1 has been used to study the dependence of the I-V curves of these devices on the semiconductor layer thickness, the Schottky barrier height at the interfaces, the high frequency dielectric constant of the semiconducting layer, and the thermal resistance, $R_{therm}$. These results can be used to engineer the device properties and indicate, for example, that increasing either the barrier height or the semiconductor layer thickness will decrease the current and increase the voltage at which the onset of NDR occurs. The results further indicate, the other hand, that increasing $R_{therm}$ will decrease the power needed to reach the NDR threshold.

Figure 10:
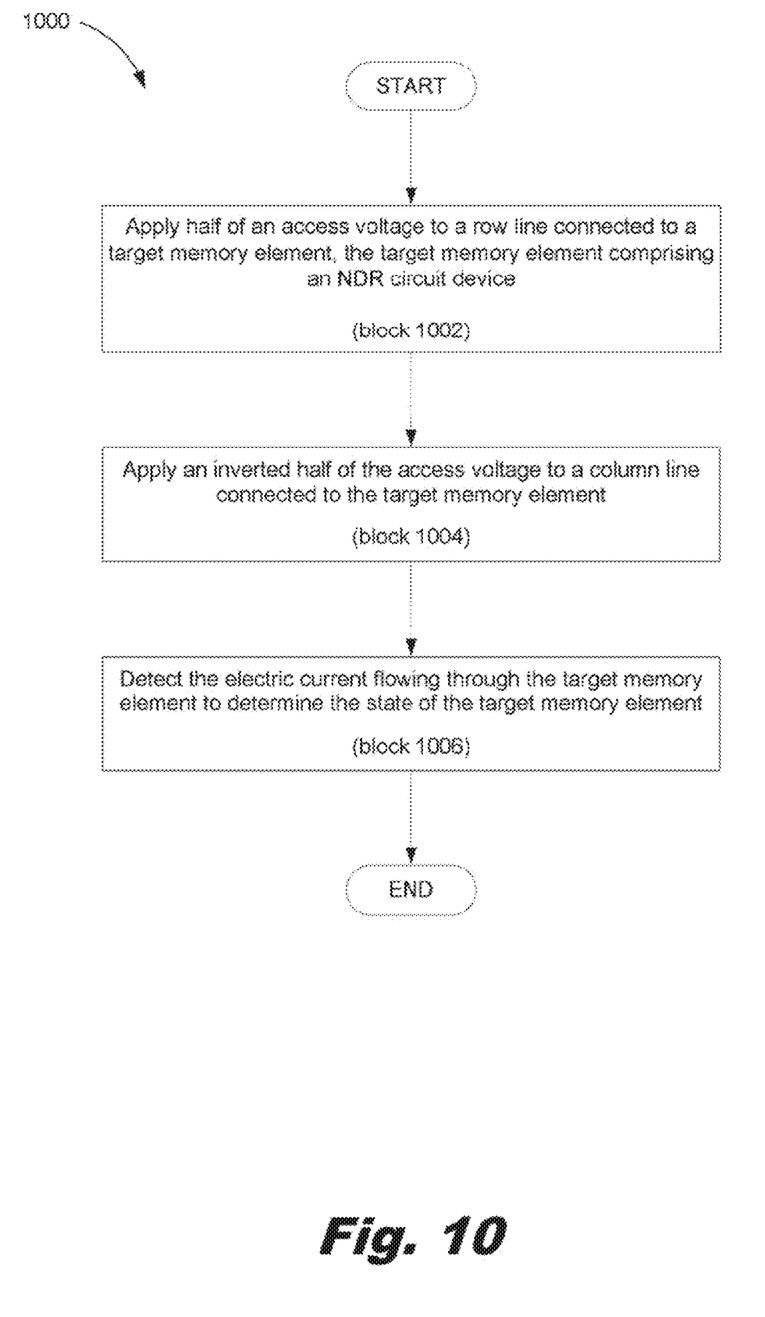
FIG. 10 is a flowchart showing an illustrative method for fabricating a crossbar array with NDR circuit devices or selectors according to one example of the principles described herein.

FIG. 10 is a flowchart showing an illustrative method for fabricating a crossbar array with NDR circuit devices. According to certain illustrative examples, the method includes applying (block 1002) a half-select access voltage to a row line connected to a target programmable element, the target programmable element comprising a NDR circuit device or selector element; applying (1004) an inverted half-select access voltage to a column line connected to the target programmable element, and detecting (block 1006) the electric current flowing through the target programmable element to determine the state of the target programmable element.

The devices described above should incorporate well within existing technologies. Through use of methods and systems described herein, a nonlinear NDR circuit device or selector element can be used in conjunction with a relatively linear memory device at each node in a crossbar memory array, increasing the number of such programmable elements that can be placed along a particular row line or column line. This allows for greater block sizes and thus more efficient and less costly memory structures. The NDR circuit devices or selector elements disclosed herein may also be substituted for selectors that exhibit non-linear I-V curves but do not exhibit NDR. Thus, the NDR circuit devices or selector elements disclosed herein enable the use of more linear memory devices and lower operating voltages than may otherwise be needed.

In addition, the analytical model indicates the temperature at which the NDR begins is relatively low in the Schottky emission-controlled devices studied and disclosed herein. For example, in the case where $T_{amb}$=300 K, the Schottky barrier height is 0.18 eV, $R_{therm}$ is $1.6 \times 10^6$ K/W, and region II is 15 nm thick, the peak temperature in the active region is only about 450 K at the onset of NDR. This indicates the power needed to operate these devices is intrinsically lower than NDR devices that rely on heating a material that exhibits an insulator-metal transition ("IMT") to a relatively high temperature. The energy needed for switching is also significantly lower than for an IMT because there is no enthalpy of transition. This makes devices that achieve NDR via a mechanism such as Schottky emission in the way described herein both less energetic and faster than those based on an IMT. Further, lower temperature of operation should improve device longevity.

The properties of the NDR circuit devices disclosed herein can be tailored through proper choice of materials and device structure. Materials can be selected that provide the desired band offset and, therefore barrier height, as well as an optimized thermal resistance. This enables better control over the voltages and currents at which NDR occurs. As apparent from the above disclosure, the NDR circuit devices disclosed herein do not need exotic or expensive materials. In addition to use as a select device, Schottky NDR and the NDR circuit devices disclosed and contemplated herein can be employed with or used to make neuristors or find uses in other active computational systems, or for amplifiers, oscillators, mixers, antennas or the like. Using Schottky barriers with appropriate dimensions and easily available materials will facilitate faster and less expensive architectures because of lower power and current needs and ambient temperatures.

Figure 11:
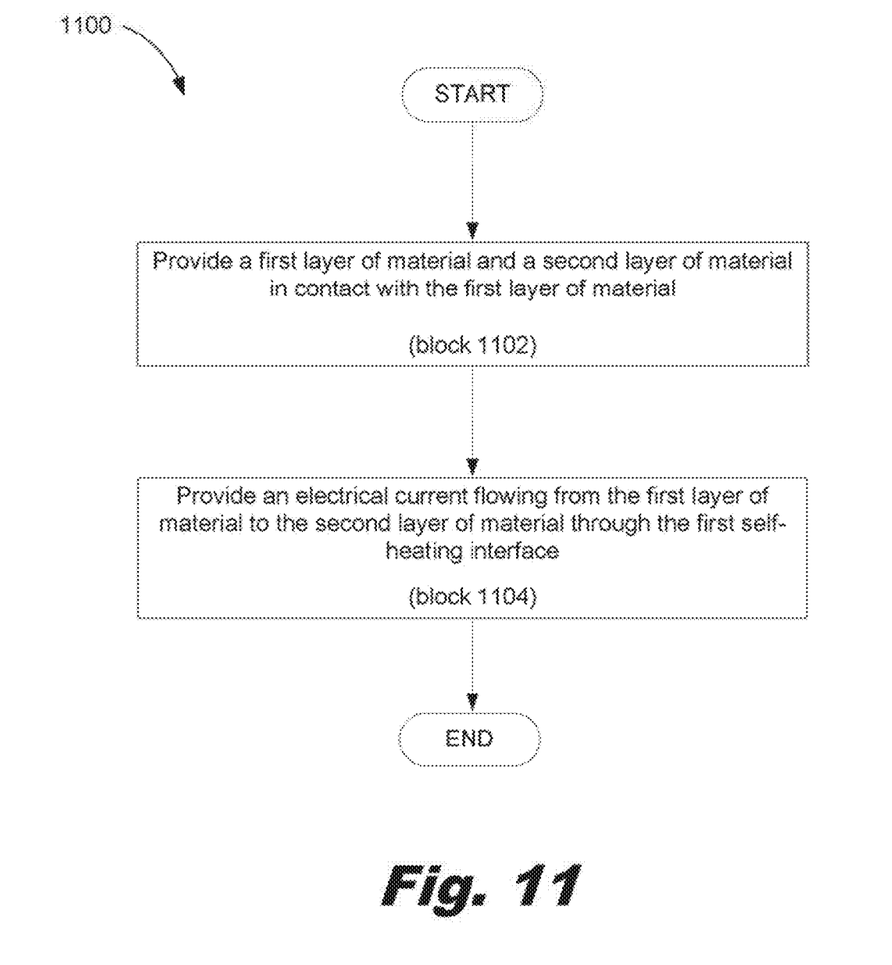
FIG. 11 is a flowchart showing an illustrative method for operating NDR circuit devices according to one example of the principles described herein.

FIG. 11 illustrates a flowchart showing an illustrative method for operating NDR circuit devices according to one example of the principles described herein. As shown in FIG. 11, a method of interfacial heating in a self-heating negative differential resistance circuit component includes providing (1102) a first layer of material and a second layer of material in contact with the first layer of material. The contact forms a first self-heating interface structured such that an electrical current flowing from the first layer of material to the second layer of material encounters an electrical impedance occurring at the first self-heating interface that is greater than any electrical impedance occurring in the first and second layers of material. Heating occurring at the first self-heating interface is dominated by joule heating caused by the electrical impedance occurring at the first self-heating interface. The electrical impedance occurring at the first self-heating interface decreases with increasing temperature to induce a region of negative differential resistance. The method concludes with providing (1104) an electrical current flowing from the first layer of material to the second layer of material through the first self-heating interface.

The preceding description has been presented only to illustrate and describe examples and examples of the principles described. This description is not intended to be exhaustive or to limit these principles to any precise form disclosed. Many modifications and variations are possible in light of the above teaching.

What is claimed is:

1. A circuit component that exhibits a region of negative differential resistance, comprising:
    a first layer of material; and
    a second layer of material in contact with the first layer of material, the contact forming a first self-heating interface;
        wherein the first self-heating interface is structured such that an electrical current flowing from the first layer of material to the second layer of material encounters an electrical impedance occurring at the first self-heating interface that is greater than any electrical impedance occurring in the first and second layers of material, wherein heating occurring at the first self-heating interface is dominated by Joule heating caused by the electrical impedance occurring at the first self-heating interface, and wherein the electrical impedance occurring at the first self-heating interface decreases with increasing temperature to induce the region of negative differential resistance; and
        wherein a thermal energy generated by the first self-heating interface is dominated by Schottky emission and the barrier height at the first self-heating interface is from about 0.1 eV (electron-volts) to about 0.5 eV.

2. The circuit component of claim 1, wherein the first layer of material is metallic and the second layer of material is semiconducting.

3. The circuit component of claim 1, wherein the first layer of material is semiconducting and the second layer of material is semiconducting.

4. The circuit component of claim 1, further comprising a third layer of material in contact with the second layer of material, the contact forming a second self-heating interface, wherein the second self-heating interface is structured such that an electrical current flowing from the third layer of material to the second layer of material encounters an electrical impedance occurring at the second self-heating interface that is greater than any electrical impedance occurring in the third and second layers of material, wherein heating occurring at the second self-heating interface is dominated by Joule heating caused by the electrical impedance occurring at the second self-heating interface, and wherein the electrical impedance occurring at the second self-heating interface decreases with increasing temperature to induce a region of negative differential resistance.

5. A self-heating negative differential resistance circuit component, comprising:
    a first layer of metallic material; and
    a second layer of semiconductor or insulator material in contact with the first layer of metallic material, the contact forming a first self-heating interface having a first electrical impedance;
    wherein the first self-heating interface is structured such that an electrical current flowing from the first layer of material to the second layer of material through the first self-heating interface results in generation of thermal energy by the first self-heating interface that is greater than any generation of thermal energy occurring in the first and second layers of material due to bulk heating;
    wherein the thermal energy generated by the first self-heating interface is dominated by Schottky emission and the barrier height at the first self-heating interface is from about 0.1 eV (electron-volts) to about 0.5 eV; and
    wherein the first electrical impedance decreases with increasing temperature to induce a region of negative differential resistance.

6. The circuit component of claim 5, wherein the first layer of metallic material and the second layer of semiconductor or insulator material are selected from the group consisting of TiN—NbO$_2$, TaN—NbO$_2$, W—Ge, Pb—Ge, Al—Ge, Ni—Ge, Au—GaAs, Au—InSb, Ag—InSb, Au—InAs, Ni—CdS (n), Cu—CdS (n), Pt—CdSe(n), Cu—CdSe(n), Ag—CdSe(n), Ta—ZnO, In—ZnO and Cu—ZnO.

7. The circuit component of claim 5, further comprising a third layer of material, the third layer of material being metallic and in contact with the second layer of material, the contact forming a second self-heating interface having a second electrical impedance, wherein the second self-heating interface is structured such that an electrical current flowing from the third layer of material to the second layer of material through the second self-heating interface results in generation of thermal energy by the second self-heating interface that is greater than any generation of thermal energy occurring in the third and second layers of material due to bulk heating and wherein the second electrical impedance decreases with increasing temperature to induce a region of negative differential resistance.

8. The circuit component of claim 7, wherein the first layer of metallic material comprises TiN, the second layer of material comprises $NbO_2$ and the third layer of material comprises TiN.

9. The circuit component of claim 7, wherein the circuit component is configured to operate as a selector in a memory structure.

10. A method of interfacial heating in a self-heating negative differential resistance circuit component, comprising:
providing a first layer of material and a second layer of material in contact with the first layer of material, the contact forming a first self-heating interface structured such that an electrical current flowing from the first layer of material to the second layer of material encounters an electrical impedance occurring at the first self-heating interface that is greater than any electrical impedance occurring in the first and second layers of material, wherein heating occurring at the first self-heating interface is dominated by Joule heating caused by the electrical impedance occurring at the first self-heating interface, and wherein the electrical impedance occurring at the first self-heating interface decreases with increasing temperature to induce a region of negative differential resistance; and
providing the electrical current flowing from the first layer of material to the second layer of material through the first self-heating interface;
wherein a thermal energy generated by the first self-heating interface is dominated by Schottky emission and the barrier height at the first self-heating interface is from about 0.1 eV (electron-volts) to about 0.5 eV.

11. The method of claim 10, wherein the first layer of material is metallic and the second layer of material is semiconducting.

12. The method of claim 10, wherein the first layer of material is semiconducting and the second layer of material is semiconducting.

13. The method of claim 10, wherein thermal energy generated by the first self-heating interface is at least about twice as great as any generation of thermal energy occurring in the first and second layers of material due to bulk heating.

* * * * *